US007034519B2

United States Patent
Abraham et al.

(10) Patent No.: US 7,034,519 B2
(45) Date of Patent: Apr. 25, 2006

(54) HIGH FREQUENCY MEASUREMENT FOR CURRENT-IN-PLANE-TUNNELING

(75) Inventors: David W. Abraham, Croton, NY (US); Daniel Worledge, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 11 days.

(21) Appl. No.: 10/753,775

(22) Filed: Jan. 8, 2004

(65) Prior Publication Data

US 2005/0151552 A1      Jul. 14, 2005

(51) Int. Cl.
  *G01R 31/02*   (2006.01)
(52) U.S. Cl. .................................. 324/158.1
(58) Field of Classification Search ................ 324/765, 324/158.1, 754, 760, 761, 762
See application file for complete search history.

(56) References Cited

U.S. PATENT DOCUMENTS 3,609,537 A * 9/1971 Healy et al. ................ 324/601
4,335,350 A * 6/1982 Chen .......................... 324/716
4,891,577 A * 1/1990 Ishikawa .................... 324/73.1
4,994,154 A * 2/1991 Chen et al. ................. 205/103

* cited by examiner

*Primary Examiner*—Vinh Nguyen
*Assistant Examiner*—Tung X. Nguyen
(74) *Attorney, Agent, or Firm*—Michael J. Buchenhorner; Wan Yee Cheung; Holland & Knight LLP

(57) ABSTRACT

An improved method and apparatus for determining a property based upon at least two measurements uses simultaneous probe signals having two different frequencies. The probe signals are produced simultaneously such that the position of the probes is identical when the probe signals are produced. The responses to the two probe signals have frequencies that correspond to the probe signals. The individual responses are isolated from each other based upon their differing frequencies by frequency lock-in circuits. By performing the measurements simultaneously, positional errors that are introduced due to small changes that occur in the position of the probes if the measurements are taken sequentially are eliminated.

11 Claims, 3 Drawing Sheets

200

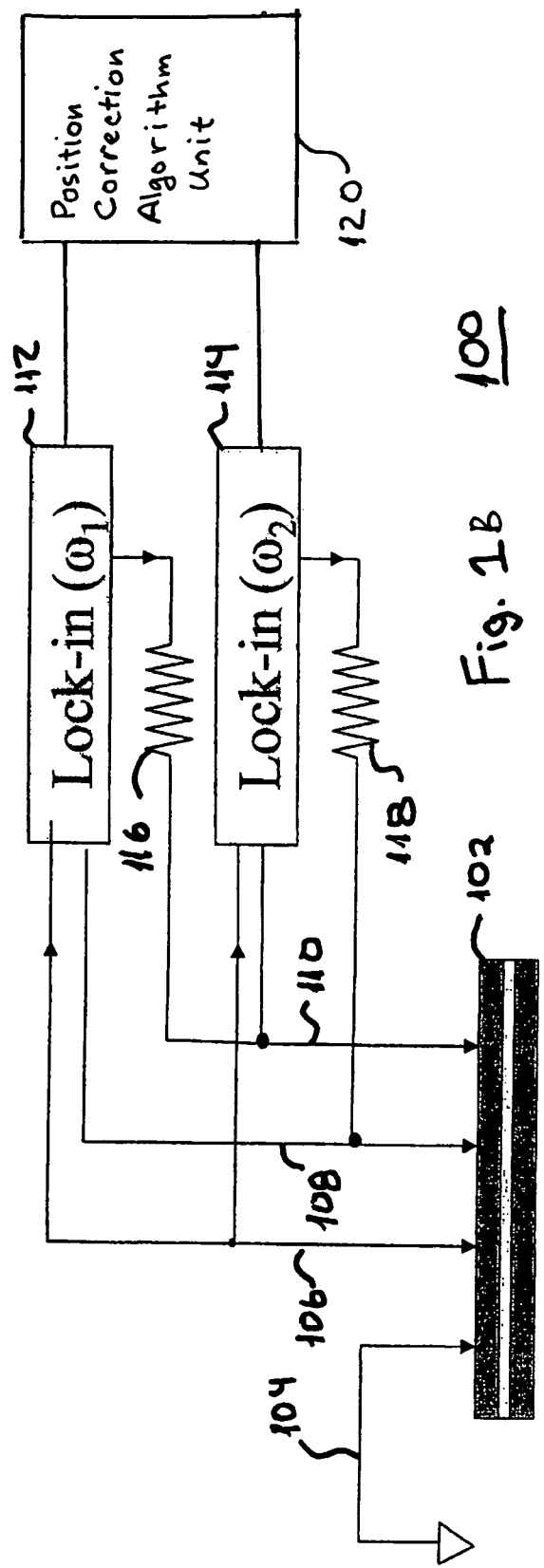

HIGH FREQUENCY MEASUREMENT FOR CURRENT-IN-PLANE-TUNNELING

CROSS-REFERENCE TO RELATED APPLICATIONS

Not Applicable.

STATEMENT REGARDING FEDERALLY SPONSORED-RESEARCH OR DEVELOPMENT

Not Applicable.

INCORPORATION BY REFERENCE OF MATERIAL SUBMITTED ON A COMPACT DISC

Not Applicable.

1. Field of the Invention

The present invention broadly relates to the field of precision measuring devices. More particularly, the present invention relates to the use of simultaneous probe signals having different frequencies to allow for the cancellation of time-dependent errors that are introduced by small changes in the position of the probes used to take the measurements when the probe signals are produced sequentially.

2. Background of the Invention

Probes for measuring resistivity in sheets and wafers are known in the art. One example of such probes is the four-point probe as shown in FIG. 1A. The purpose of a 4-point probe is to measure the resistivity of a semiconductor material. It can measure either bulk or thin film specimens.

Referring to FIG. 1A, there is shown a four-point resistivity probe 10. The probe 10 comprises four electrodes 11, 12, 13, and 14 for probing a wafer 15. In this example consider each of the electrodes to be equally spaced. The probe is placed in the interior of the sample, and the probes are collinear. Generally, the probe 10 works by applying a known level of current, I, between electrodes 11 and 14 via the wafer 15. Then the voltage, V, between electrodes 12 and 13 is measured. In this example, the polarity of current I or the voltage V could be the reverse of what is shown. In this case electrode 14 is a current source and electrode 11 collects the current while the voltage difference across electrodes 13 and 12 is measured. The current represented by arrow 19 actually flows throughout various paths in the wafer 15, defining a resistance network. The current 16 creates an electric field to be measured using a voltage meter. The resistance per square ($R_\square$) also referred to as "$R_{sq}$" is derived from these measurements according to well known relationships between the measured parameters. In the prior art it was known to make measurements using combinations of probes other than the one discussed but only one such combination was used to derive the resistance per square for a wafer. In the prior art more than one combination of probes was used when the probes were placed on the perimeter of the sample. Here we restrict ourselves to cases where the probes are placed in the interior of the sample.

As used herein, a "probe" is a device that is not affixed to the surface being measured. A probe can be affixed to an intermediate metal structure, such as a contact pad. Electric coupling of the probe to the tunnel junction film stack can occur through physical contact between the probe and the surface of the tunnel junction film stack, through a probe that is affixed to an intermediate metal structure, or through other techniques known to those skilled in the art.

Referring again to FIG. 1A there is shown an example of a device some researchers have used to measure resistance of tunnel junction films. A portion of a semiconductor wafer 15 to be measured is shown. The wafer 15 comprises a substrate 21 and an unprocessed stack 16 having a number of tunnel junction films. The tunnel junction films comprise the top layer 20, tunnel barrier 18, and bottom layer 17. The four-point probe 10 comprising probes 11, 12, 13, and 14, each separated by a distance, a, so that the entire distance from start to end of the four-point probe 100 is L. Each probe 11 through 14 contacts the top surface 17 of top layer 20. Probe 11 is used to inject current I, and probe 14 is used to collect the current after it passes through the unprocessed stack 16. Probes 12 and 13 are used to measure voltage V.

The four-point probe 10 is a well known tool used to characterize many different types of semiconductors and other materials. In fact, it is used to characterize Giant Magneto Resistive (GMR) films, which are used in read and write heads of many current hard drives. In GMR, the tunnel barrier 18 is replaced by a metal, which allows current to flow to the pinned layer 17. The four point probe 10 is also commonly used to measure the resistance of a blanket film. In this case the unprocessed stack 16 is composed of one or more conducting layers.

The resistance per square ($R_\square$), of the material of the wafer 15, is defined by the relationship $R_\square = \rho/t$, where $\rho$ is the resistivity and t is the thickness of the material (wafer 15). Resistivity is a property of the material.

The method for measuring resistance or resistivity of wafer materials used by the apparatus of FIG. 1A works well for many purposes; however errors can occur in the resistivity measurements caused by the position of the probe points on the subject wafer or sheet.

Current-In-Plane-Tunneling (CIPT) is a method of electrically probing a thin magnetic film containing various layers of metal and insulating barriers in such a way as to provide a direct measurement of resistance of the constituent layers. Prior art methods have been disclosed for performing CIPT measurements of magneto-resistance and resistance-area product for unpatterned magnetic tunnel junction film stacks. One such method relies upon the dependence of a probe's signal on the probe's placement on the film stack. In accordance with the method, the probes are positioned in a range of different locations on the stack on which the measurements are to be taken. The signals received by the probes in response to the probe signals are then used to calculate the desired properties of the stack. This method has been shown to be effective in accurately measuring electrical parameters for film stacks. In addition, it has been shown that further improvements in the measurement accuracy of these measurements can be obtained by examining two particular combinations of the measurements in any given four point probe configuration. Using a combination such as an average of the measurements results in a reduction of the static positional accuracy requirements of the probe placement. In such a technique, current is applied to two of the four probes and the resultant voltage is measured across the remaining two probes. Then, current is inserted into a different pair of probes and again the voltage is measured across the remaining two probes. By properly choosing the probes and combining the measured voltage signals improved measurements can be obtained. However, measurement noise due to the slight motion of the probes on the sample surface that occurs between the time of the two measurements remains a source of measurement error. Furthermore, the probe motion that causes the measurable errors is physically quite small, in the range of 20 nanometers (nm) of motion per probe. Unfortunately, due to the extremely small magnitude of the probe motion, it is very difficult to mechanically improve the measurement system to eliminate this miniscule motion. Therefore, an improved method and apparatus for performing such a test is needed.

SUMMARY OF THE INVENTION

One application of the present invention is directed toward a method of performing a measurement of a property of an object wherein the measurement is based upon at least two readings from at least two probes. In accordance with the method, each probe is positioned at a different location on the object to be measured. Preferably, the location of the first probe is within 100 micrometers of the location of the second probe. A first alternating current is applied to the first probe at a first location on the object. Simultaneously, a second alternating current is applied to the second probe at a second location on the object. The first alternating current has a different frequency than the second alternating current. A first voltage response produced in response to the first alternating current is measured and a second voltage response produced in response to the second alternating current is also measured. The first voltage response is isolated from the second voltage response based upon the frequencies of the first and second voltage responses. In a four point probe system, the first voltage response is measured between the second probe and a third probe and the second voltage response is measured between the first probe and the third probe. The measurement of the property is then determined based upon the first measurement reading and the second measurement reading. The property measured preferably is a resistance per square of the object.

Another application of the present invention is directed toward a method of performing a measurement of a property of an object wherein the measurement is based upon the object's response to at least two probe signals. In accordance with this application, a first probe signal is produced having a first signal frequency and the first probe signal is applied to the test object. A second probe signal is simultaneously produced having a second signal frequency and the second probe signal is applied to the test object. The first probe signal is preferably applied to the object at a different location than the second probe signal. A response to the first probe signal is isolated from a response to the second probe signal based upon the first signal's frequency and the second signal's frequency. The responses are isolated by receiving a first voltage response having a frequency substantially equal to the first signal frequency with a first lock-in circuit and receiving a second voltage response having a frequency substantially equal to the second signal frequency with a second lock-in circuit. The first and second responses are used to determine a desired property of the object such as its resistance per square.

Yet another application of the present invention is directed toward a measurement system for measuring a property based upon simultaneous probe readings. The measurement system includes a first probe for providing a first probe signal having a first frequency. A second probe provides a second probe signal having a second frequency different from the first. An isolation circuit isolates a response to the first probe signal from a response to the second probe signal. The isolation circuit may include a frequency filter for isolating the response to the first probe signal from the response to the second probe signal based upon the frequencies of the probe signals. Alternatively, the isolation circuit may include a first frequency lock-in circuit configured to receive the response to the first probe signal and a second frequency lock-in circuit configured to receive the response to the second probe signal. The lock-in circuits may further be lock-in amplifiers such that the lock-in amplifiers also produce the first and second probe signals. In such a case, a pair of bias resistors are included and each of the first and second probe signals are provided to the object by the lock-in amplifiers through an associated one of the pair of bias resistors. An algorithm unit calculates the property based upon the responses to the first and the second probe signals. A third probe may be provided such that the response to the first probe signal is measured between the second probe and the third probe and the response to the second probe signal is measured between the first probe and the third probe.

BRIEF DESCRIPTION OF THE DRAWINGS

FIG. 1B is a simplified schematic of a circuit for implementing a preferred embodiment of the present invention.

DETAILED DESCRIPTION

Figure 1A:
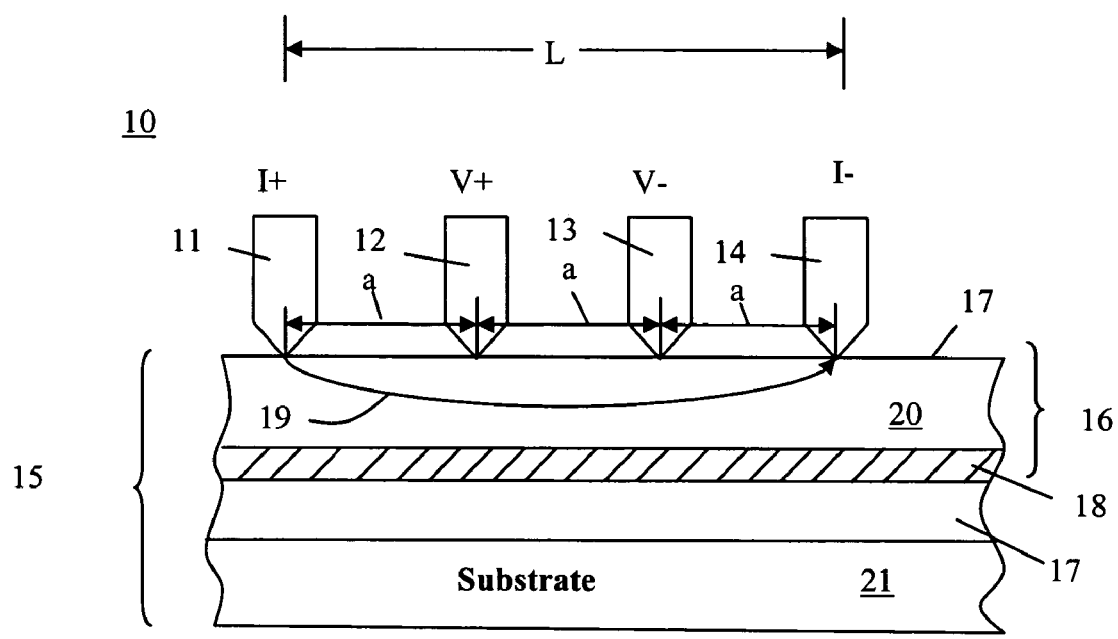
FIG. 1A is a schematic of a known four-point probe.

Referring now to FIG. 1B, a schematic of a measurement system 100 constructed in accordance with a preferred embodiment of the present invention is shown. The measurement system 100 is preferably used to measure a property such as the resistance per square or the magnetoresistance or areal resistance of a film stack 102. The embodiment of the system 100 shown in FIG. 1A utilizes four probes 104, 106, 108 and 110. Probe 104 provides a ground reference for the measurement system 100. Two lock-in circuits 112 and 114 are used to provide probe signals to the probes 108 and 110 and receive response signals from probes 106, 108 and 110. The first lock-in circuit 112 produces a first probe signal having a first frequency of $\omega_1$. Preferably, the first probe signal is a current signal. The first probe signal is provided from the lock-in circuit 112 to the probe 110 through a bias resistor 116. In response to the first probe signal, a corresponding voltage is created between probes 106 and 108. This voltage has the same approximate frequency as the first probe signal. The voltage response is received by the lock-in circuit 112 through probes 106 and 108. The lock-in circuit 112 isolates the voltage response from other signals having different frequencies.

Substantially simultaneously with the sending of the first probe signal from the first lock-in circuit 112, a second probe signal having a second frequency, $\omega_2$, is produced by the second lock-in circuit 114 and sent to probe 108 through bias resistor 118. The second probe signal is also preferably an electrical current that induces a voltage response across probes 106 and 110 that has the same approximate frequency as the second probe signal. This voltage response to the second probe signal is read by the second lock-in circuit 114. The second lock-in circuit 114 isolates the second voltage response from the first voltage response based upon its frequency. The two voltage responses are then received by a position correction algorithm unit 120 that calculates the desired measurement quantity such as the resistance of the film stack 102 per unit of area in accordance with the prior art methods discussed above. However, since the probe signals were produced and received simultaneously, the position of the probes 104, 106, 108 and 110 is practically identical for the two measurements. Thus, any errors that would be introduced into the process if the two measurements were taken at slightly different times due to minute changes in the positions of the probes 104, 106, 108 and 110 are eliminated.

Figure 2:
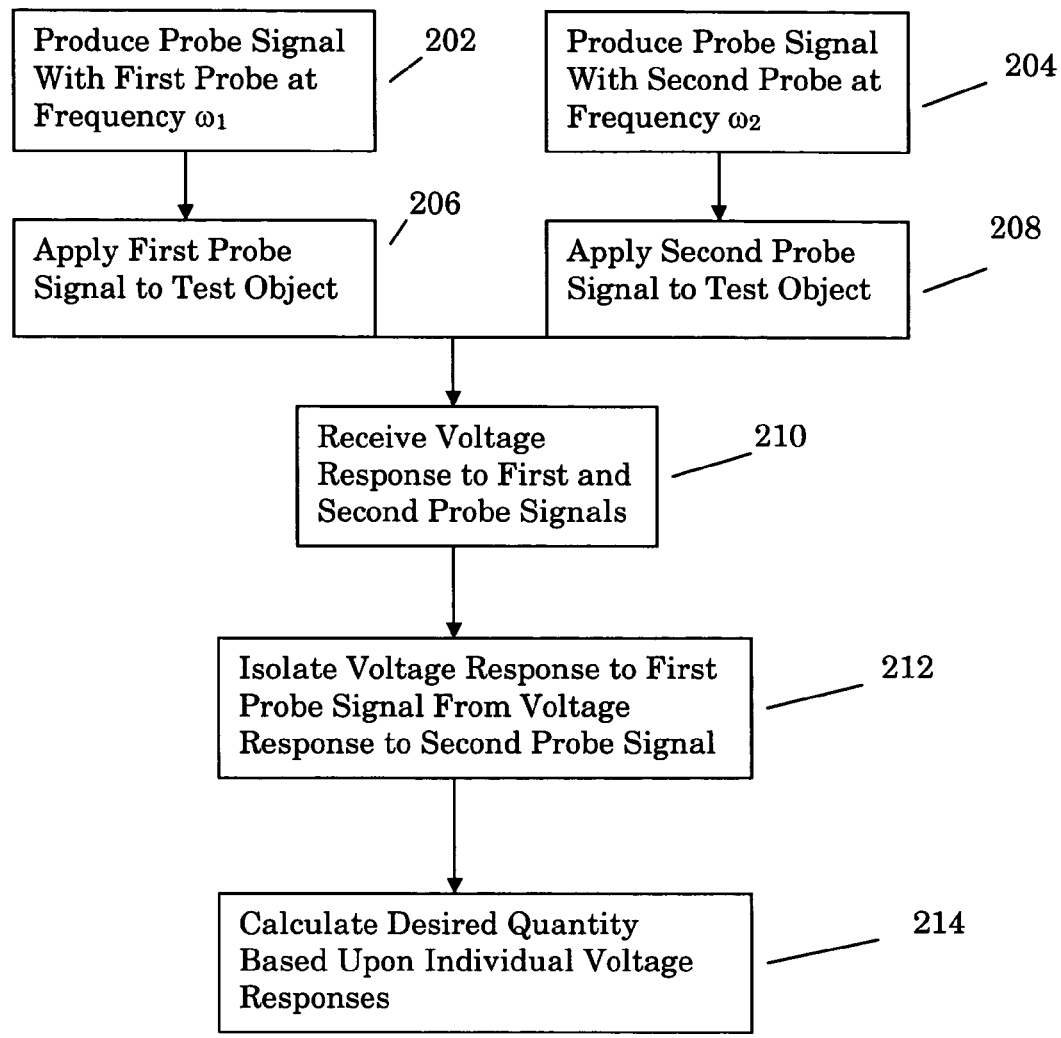
FIG. 2 is a flow chart of a preferred method for implementing the present invention.

Referring to FIG. 2, there is shown a flow chart illustrating a method 200 according to the invention. The method 200 commences in steps 202 and 204 with the simultaneous production of a first probe signal at a first frequency $\omega_1$ and a second probe signal at a second frequency $\omega_2$. The first and second probe signals are then applied to the desired object at different locations in steps 206 and 208. In step 210, a voltage response is received in response to the sending of the two probe signals. A voltage response at substantially the same frequency as the first probe signal is isolated from a voltage response at substantially the same frequency as the second probe signal in step 212. Preferably, the voltage responses are isolated and received by the same circuits that produced the associated probe signals. In step 214, the desired quantity to be measured is then calculated based upon the isolated frequency responses in step 212.

Using simultaneous probe signals produced at different frequencies allows multiple probe readings to be acquired while the position of the probes on the surface of the object remain exactly the same. This eliminates positional errors that are introduced by the inevitable small changes in the position of the probes that occur over even small periods of time. Furthermore, the increase in measurement accuracy is obtained with a simple, inexpensive and reliable circuit. Therefore, the present invention is a substantial improvement upon the prior art.

What has been shown and discussed is a highly-simplified depiction of a computer controlled testing apparatus. Those skilled in the art will appreciate that other low-level components and connections are required in any practical application of such a computer based apparatus. Therefore, while there has been described what is presently considered to be the preferred embodiment, it will be understood by those skilled in the art that other modifications can be made within the spirit of the invention.

What is claimed is:

1. A method of performing a measurement of a property of an object wherein the measurement is based upon the object's response to at least two probe signals, the method comprising:
   producing a first probe signal having a first signal frequency and applying the first probe signal to the test object;
   simultaneously producing a second probe signal having a second signal frequency and applying the second probe signal to the object; and
   isolating a response to the first probe signal from a response to the second probe signal based upon the first signal's frequency and the second signal's frequency, wherein the step of isolating the response comprises receiving a first voltage response having a frequency substantially equal to the first signal frequency with a first lock-in circuit and receiving a second voltage response having a frequency substantially equal to the second signal frequency with a second lock-in circuit.

2. The method of claim 1 wherein the first probe signal is applied to the object at a different location than the second probe signal.

3. The method of claim 1 comprising using the first and the second response to determine the property of the object.

4. The method of claim 1 wherein the property is a resistance property of the object.

5. A measurement system for measuring a property of an object based upon simultaneous probe readings, the measurement system comprising:
   a first probe for providing a first probe signal having a first frequency;
   a second probe for providing a second probe signal having a second frequency; and
   an isolation circuit for isolating a response to the first probe signal from a response to the second probe signal, wherein the isolation circuit further comprises a first frequency lock-in circuit configured to receive the response to the first probe signal and a second frequency lock-in circuit configured to receive the response to the second probe signal.

6. The measurement system of claim 5 wherein said isolation circuit comprises a frequency filter for isolating the response to the first probe signal from the response to the second probe signal based upon the frequencies of the probe signals.

7. The measurement system of claim 5 wherein the lock-in circuits comprise lock-in amplifiers and the lock-in amplifiers produce the first and the second probe signals.

8. The measurement system of claim 7 comprising a pair of bias resistors wherein each of the first and the second probe signals are provided to the object by the lock-in amplifiers through an associated one of the pair of bias resistors.

9. The measurement system of claim 5 comprising an algorithm unit for calculating the property of the object based upon the responses to the first and the second probe signals.

10. The measurement system of claim 5 further comprising a third probe and wherein the response to the first probe signal is measured between the second probe and the third probe.

11. The measurement system of claim 10 wherein the response to the second probe signal is measured between the first probe and the third probe.

* * * * *